(12) United States Patent
Cohen et al.

(10) Patent No.: US 11,733,364 B2
(45) Date of Patent: Aug. 22, 2023

(54) TARGET RANGING WITH SUBSAMPLED NOISE CORRELATION

(71) Applicants: KRATOS SRE, Inc., San Diego, CA (US); The University of Alabama in Huntsville, Huntsville, AL (US)

(72) Inventors: Seth D. Cohen, Birmingham, AL (US); Aubrey Beal, Huntsville, AL (US)

(73) Assignees: Kratos SRE, Inc., San Diego, CA (US); The University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 17/327,403

(22) Filed: May 21, 2021

(65) Prior Publication Data
US 2021/0364617 A1  Nov. 25, 2021

Related U.S. Application Data

(60) Provisional application No. 63/028,389, filed on May 21, 2020.

(51) Int. Cl.
*G01S 13/10* (2006.01)
*H03K 3/037* (2006.01)
(Continued)

(52) U.S. Cl.
CPC ............ *G01S 13/106* (2013.01); *G01S 7/282* (2013.01); *H03K 3/037* (2013.01); *H03K 5/01* (2013.01); *H03K 2005/00078* (2013.01)

(58) Field of Classification Search
CPC .......... G01S 13/106; G01S 7/282; G01S 7/35; G01S 13/346; H03K 3/037; H03K 5/01; H03K 2005/00078; H03K 5/133
(Continued)

(56) References Cited

U.S. PATENT DOCUMENTS 3,614,626 A * 10/1971 Dillard .................... G01S 7/021
455/296
4,318,183 A    3/1982 Byington et al.
(Continued)

OTHER PUBLICATIONS

Abid, A et al. "Implementation of a Chaotically Encrypted Wireless Communication System" [online publication] IEEE; Jul. 2009 [retrieved online Jul. 8, 2019] <URL: http://citeseerx.istpsu.edu/viewdoc/download?doi=10.1.1.888.9660&rep=rePl&type=pdf> DOI: 10.1109/ICC.2009.5199069; fourth page, first column.
(Continued)

*Primary Examiner* — Ryan Jager
(74) *Attorney, Agent, or Firm* — Ballard Spahr LLP

(57) ABSTRACT

Backend components for noise radar and techniques for operation of those components are provided. Some embodiments include noise radar apparatuses. A noise radar apparatus may include a first unit that generates a random signal or a broadband noise signal using asynchronous logic gates constituting the first unit. The noise radar apparatus also may include a second unit that generates a reference sequence using the generated random signal or the generated broadband noise signal. The second unit comprises at least one tapped delay line formed by second asynchronous logic gates having sampling functionality and storage functionality. The noise radar apparatus may further include a third unit that receives a return signal correlates the return signal and the reference sequence in nearly real-time using third asynchronous logic gates constituting the third unit.

20 Claims, 11 Drawing Sheets

(51) Int. Cl.
*G01S 7/282* (2006.01)
*H03K 5/01* (2006.01)
*H03K 5/00* (2006.01)

(58) Field of Classification Search
USPC .......................................................... 342/202
See application file for complete search history.

(56) References Cited

U.S. PATENT DOCUMENTS

| | | | |
|---|---|---|---|
| 4,321,547 A | 3/1982 | Pickard et al. | |
| 4,551,816 A | 11/1985 | Hyatt | |
| 4,581,715 A | 4/1986 | Hyatt | |
| 4,698,635 A * | 10/1987 | Hilton | G01S 13/89 342/120 |
| 4,944,036 A | 7/1990 | Hyatt | |
| 5,426,433 A | 6/1995 | Gertel | |
| 5,517,155 A | 5/1996 | Yamauchi et al. | |
| 5,774,084 A | 6/1998 | Brombaugh et al. | |
| 5,805,094 A | 9/1998 | Roach et al. | |
| 6,072,340 A | 6/2000 | Deisch | |
| 6,091,354 A * | 7/2000 | Beckner | G01S 13/0209 342/22 |
| 6,177,904 B1 * | 1/2001 | Coenen | G01S 7/292 342/195 |
| 6,504,427 B2 | 1/2003 | Midya et al. | |
| 6,507,177 B2 | 6/2003 | Flock et al. | |
| 7,151,483 B2 * | 12/2006 | Dizaji | G01S 13/284 342/134 |
| 7,457,291 B2 | 11/2008 | Lee et al. | |
| 7,613,212 B1 | 11/2009 | Raz et al. | |
| 7,656,341 B2 * | 2/2010 | Reeves | G01S 13/32 342/195 |
| 7,782,017 B2 | 8/2010 | Hack et al. | |
| 7,844,796 B2 | 11/2010 | Vorbach et al. | |
| 8,174,293 B2 * | 5/2012 | Yoshihara | G04F 10/005 327/107 |
| 8,325,076 B2 | 12/2012 | Yousif et al. | |
| 9,252,809 B2 * | 2/2016 | Hirth | H04L 1/0047 |
| 10,218,343 B1 | 2/2019 | Tomar et al. | |
| 10,656,244 B2 * | 5/2020 | Turbiner | G01S 13/288 |
| 10,746,849 B2 * | 8/2020 | Turbiner | G01S 7/487 |
| 11,265,178 B1 * | 3/2022 | Cohen | G06F 21/73 |
| 11,381,224 B2 * | 7/2022 | Cohen | H03K 3/017 |
| 2002/0080889 A1 | 6/2002 | Dress, Jr. et al. | |
| 2002/0191690 A1 | 12/2002 | Pendergrass et al. | |
| 2004/0177310 A1 | 9/2004 | Mohan et al. | |
| 2005/0036479 A1 | 2/2005 | Lee et al. | |
| 2005/0078021 A1 | 4/2005 | Cohen et al. | |
| 2005/0206544 A1 | 9/2005 | Schallmoser | |
| 2006/0088081 A1 | 4/2006 | Withington et al. | |
| 2007/0040608 A1 | 2/2007 | Magrath et al. | |
| 2007/0110125 A1 | 5/2007 | Fujita et al. | |
| 2007/0291833 A1 | 12/2007 | Shimanskiy | |
| 2008/0204309 A1 * | 8/2008 | Reeves | G01S 13/32 342/195 |
| 2009/0135053 A1 * | 5/2009 | Negoro | H04B 1/707 342/195 |
| 2010/0164806 A1 | 7/2010 | Pillai | |
| 2010/0244958 A1 | 9/2010 | Tsuji et al. | |
| 2012/0068781 A1 | 3/2012 | Pfaffinger | |
| 2012/0146842 A1 * | 6/2012 | Kang | H01Q 3/44 342/175 |
| 2012/0268105 A1 | 10/2012 | Mann et al. | |
| 2012/0326760 A1 | 12/2012 | Kesselring et al. | |
| 2013/0015992 A1 | 1/2013 | Horio et al. | |
| 2013/0057423 A1 | 3/2013 | Kurchuk et al. | |
| 2015/0041625 A1 | 2/2015 | Dutton et al. | |
| 2018/0059215 A1 * | 3/2018 | Turbiner | G01S 15/931 |
| 2019/0271959 A1 | 9/2019 | Firu et al. | |
| 2021/0247722 A1 * | 8/2021 | Cohen | H03M 1/504 |
| 2021/0364617 A1 * | 11/2021 | Cohen | G01S 13/346 |

OTHER PUBLICATIONS

Cohen, Seth D., "Structured scale-dependence in the Lyapunov exponent of a Boolean chaotic map," 2015.
International Search Report and Written Opinion issued in application No. PCT/US2019/036371 dated Sep. 16, 2019.
International Search Report and Written Opinion issued in related application PCT/US2019/036372 dated Oct. 28, 2019.
Beal, Aubrey N. et al., "Generating and Detecting Solvable Chaos at Radio Frequencies with Consideration to Multi-User Ranging," Sensors, 2020, 20, 774.
Cohen, S.D. et al., "A pseudo-matched filter for chaos," Chaos, 2012, pp. 1-10, vol. 22, issue 033148, American Institute of Physics.
Munoz-Pacheco, J.M. et al., "Two New Asymmetric Boolean Chaos Oscillators with No Dependence on Incommensurate Time-Delays and Their Circuit Implementation," Symmetry, 2020, pp. 1-16, vol. 22, issue 506, MDPI.
Rosin, D.P. et al., "Experiments on autonomous Boolean networks," Chaos, 2013, pp. 1-9, vol. 23, issue 025102, AIP Publishing LLC.
Rosin, D.P. et al., "Ultrafast physical generation of random numbers using hybrid Boolean networks," Physical Review E, 2013, pp. 1-4, vol. 87, issue 040902(R), American Physical Society.
Tsividis, Y., "Event-Driven Data Acquisition and Digital Signal Processing—A Tutorial," IEEE Transactions on Circuits and Systems—II: Express Briefs, 2010, pp. 577-581, vol. 57, issue 8, IEEE.
Turin, G.L., "An Introduction to Digital Matched Filters," Proceedings of the IEEE, 1976, pp. 1092-1112, vol. 64, issue 7, IEEE.
Xu, H. et al., "A High-Resolution Leaky Coaxial Cable Sensor Using a Wideband Chaotic Signal," Sensors, 2018, pp. 1-12, vol. 18, issue 4154, MDPI.
Zhang, R. et al., "Boolean chaos," Physical Review E, 2009, pp. 1-4, vol. 80, issue 045202(R), The American Physical Society.
Zhang, R et al., "Boolean Chaos," niln.cd, 2009.

* cited by examiner

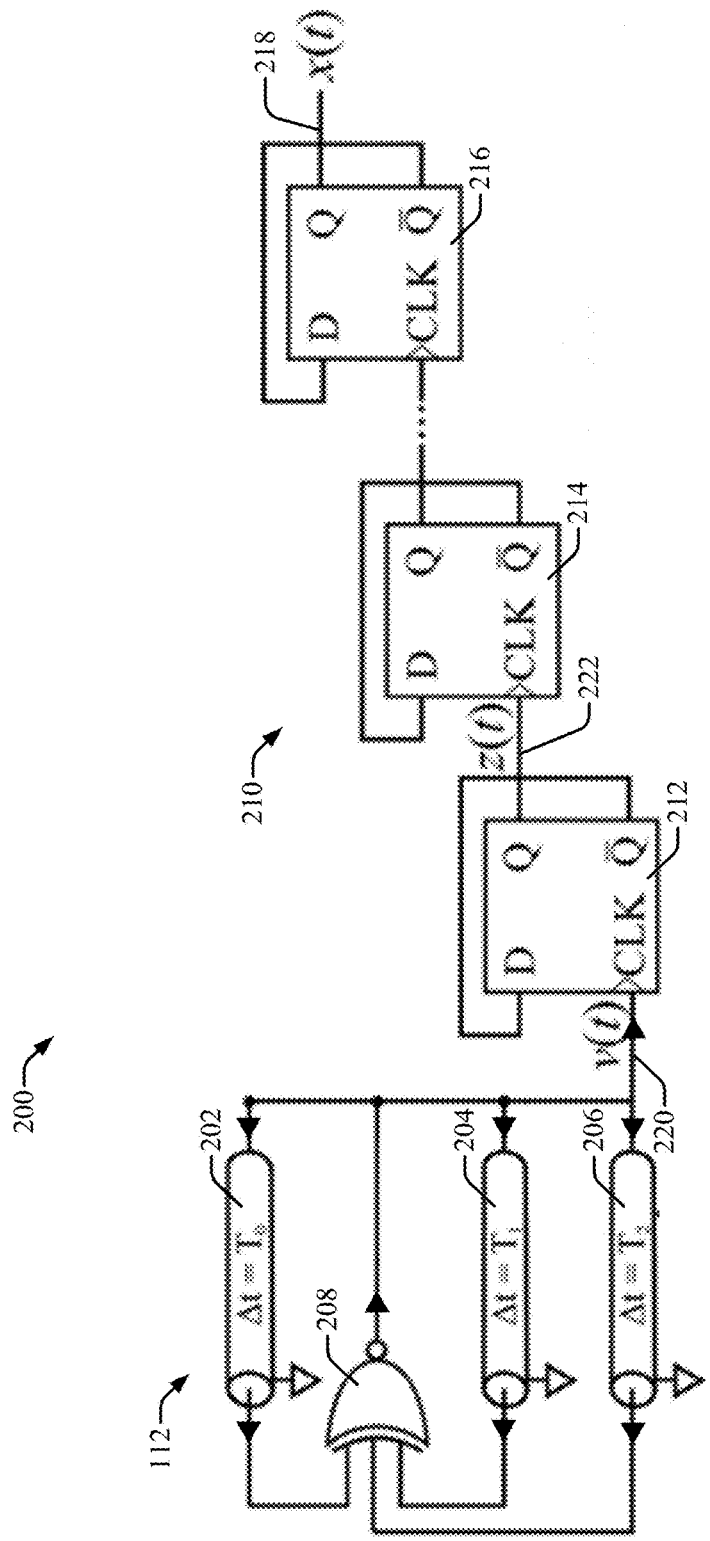
FIG. 2A
FIG. 2B
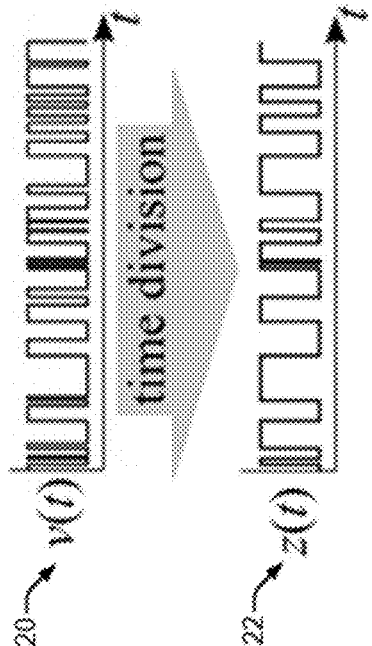
FIG. 2C

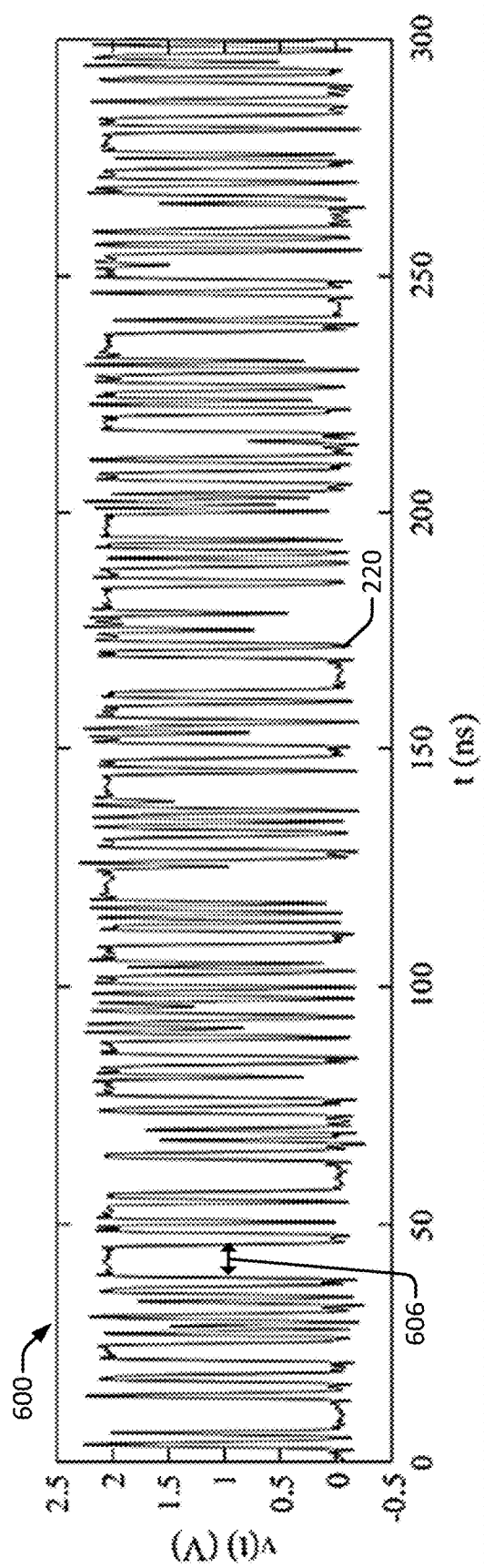
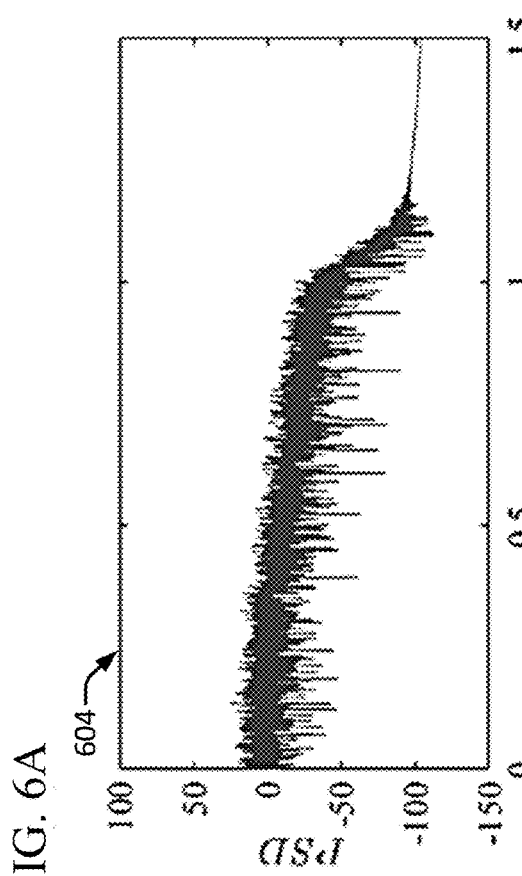
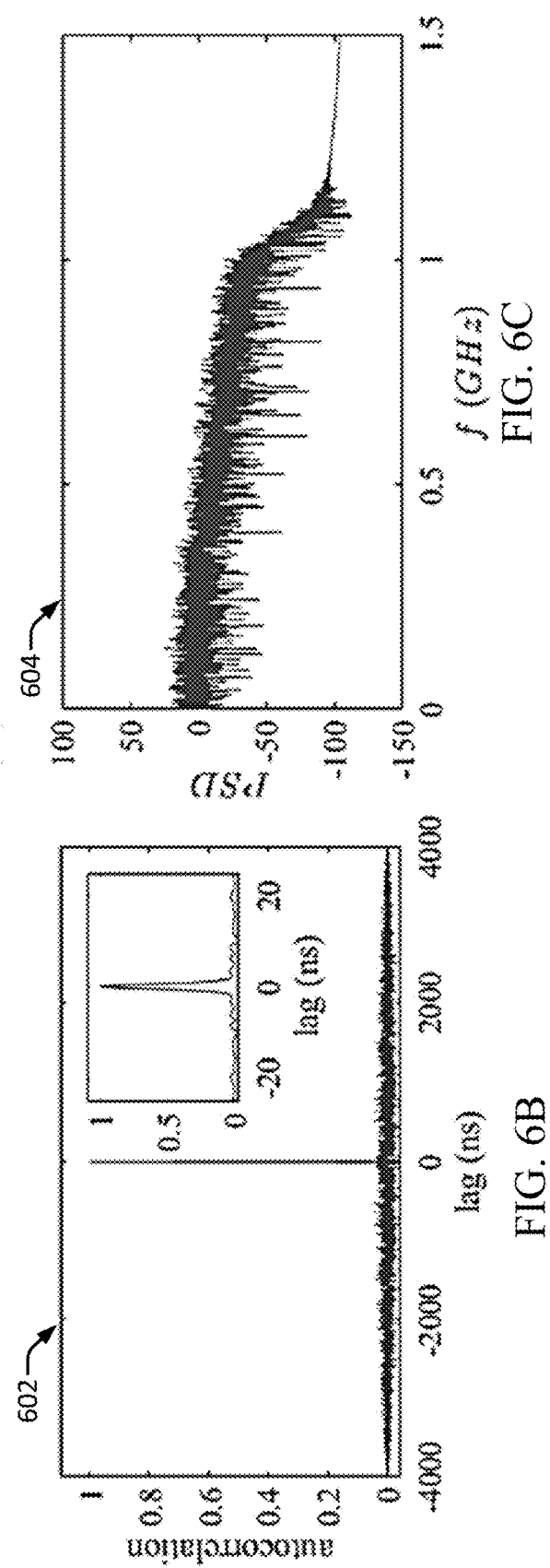
FIG. 6A
FIG. 6C
FIG. 6B

TARGET RANGING WITH SUBSAMPLED NOISE CORRELATION

CROSS-REFERENCE TO RELATED APPLICATIONS

This application claims the benefit of U.S. Provisional Application No. 63/028,389, filed May 21, 2020, which is incorporated herein by reference in its entirety.

BACKGROUND

Commonplace noise radar systems may utilize uncorrelated signals generated by means of an algorithm, such as a pseudo-random number generator (PRNG) that is clocked or an analog source. Reliance on a PRNG may result in various technical challenges. For example, the bandwidth of the PRNG may be inherently limited to the clock speed, which in turn may limit the range resolution of the noise radar. Further, in multichannel scenarios, PRNGs eventually repeat a sequence of pseudo-random numbers, and thus repeat the uncorrelated signal corresponding to that sequence. As a result, the PRNGs may limit the number of channels that may be simultaneously used in a noise radar apparatus.

True analog noise sources typically require analog electronics or optics and, thus, present other technical challenges. For example, additional hardware may be necessary to create these types of uncorrelated signals that rarely (if ever) repeat. In addition, if the full amplitude of the analog noise source is used for ranging, then wideband direction couplers and correlators may be necessary in order to direct and process the information content of transmitted and received electromagnetic radiation waveforms. Therefore, much remains to be improved in technologies for noise radar systems.

SUMMARY

Disclosed is a radar or ranging system in accordance with one or more implementations of the present disclosure. The device may include storage circuitry having a first tap. The storage circuitry may be configured to transmit a noise signal comprising switching frequencies defining digital transitions of the noise signal. The switching frequencies may have a maximum switching frequency. The maximum switching frequency may have a shortest mean period between the digital transitions with respect to the switching frequencies. The ranging system may also include a register operable to receive the noise signal according to the first tap. The register may be configured to store the noise signal according to a clock signal having a clock frequency less than the maximum switching frequency.

Also disclosed is method in accordance with one or more implementations of the present disclosure. The method may include generation of a signal. The signal may include switching frequencies defining digital transitions of the noise signal. The switching frequencies may have a maximum switching frequency. The maximum switching frequency may have a shortest mean period between the digital transitions with respect to the switching frequencies. The method may also include tapping the signal to store contemporaneous values of the signal in registers according to a clock signal. The clock signal may have a clock frequency less than the maximum switching frequency.

Also disclosed is a radar or ranging system in accordance with one or more implementations of the present disclosure. The ranging system may include correlator circuitry having a correlator tap. The correlator circuitry may be operable to receive a reflected signal based on a noise signal reflected from a target. The noise signal may include switching frequencies defining digital transitions of the noise signal. The switching frequencies may include a maximum switching frequency. The maximum switching frequency may have a shortest mean period between the digital transitions with respect to the switching frequencies. The ranging system may include an exclusive NOR gate configured to receive the correlator tap and a binary value based on the noise signal.

BRIEF DESCRIPTION OF THE DRAWINGS

The annexed drawings are an integral part of the disclosure and are incorporated into the present specification. The drawings illustrate examples of embodiments of the disclosure and, in conjunction with the description and claims, serve to explain, at least in part, various principles, features, or aspects of the disclosure. Some embodiments of the disclosure are described more fully below with reference to the drawings. However, various aspects and elements of the disclosure may be implemented in many different forms and should not be construed as being limited to the implementations set forth herein. Like numbers refer to like, but not necessarily the same or identical, elements throughout. The accompanying drawings may be briefly characterized as follows.

FIG. 2A illustrates an example of a noise unit that may be integrated into noise radar apparatuses in accordance with one or more implementations of this disclosure.

FIG. 2B illustrates an example of a delay circuitry in accordance with one or more implementations of this disclosure.

FIG. 2C illustrates an example time division in accordance with one or more implementations of this disclosure.

FIG. 6A illustrates experimental baseband switching noise (deemed Boolean chaos in the literature) generated using asynchronous gates on a FPGA, in accordance with one or more implementations of this disclosure.

FIG. 6B illustrates the autocorrelation function, demonstrating the uncorrelated and random nature of the baseband switching noise.

FIG. 6C illustrates power spectral density (PSD), demonstrating the uncorrelated and random nature of the baseband switching noise.

DETAILED DESCRIPTION

This disclosure recognizes and addresses various issues in conventional noise radar architectures. Those architectures may include multi-user/multi-channel noise radar system and apparatuses. Implementations of the technologies of this disclosure include systems, apparatuses, devices, and techniques for noise radar architectures that may include backend components formed from asynchronous gate arrays or other types of asynchronous logic elements, without reliance on analog sources or optic elements, or both. Put another way, techniques taught herein may incorporate combinations of multi-user/multi-channel noise radar systems and backend components formed from asynchronous gate arrays or other types of asynchronous logic elements and the techniques may further rely on analog sources, optic elements, or combinations thereof. The techniques taught herein may be used with various wave or signal types. For example, waves related to the electromagnetic or sound spectrums may be used. The waves may be propagated through various mediums. For example, waves may propagate through cabling, atmosphere, space, and various other mediums. In some implementations, the disclosed backend components and other components described may be integrated into a single chipset. In other implementations, the disclosed backend components and other components described may be integrated into respective chipsets. In yet other implementations, a first group of the backend components may be integrated into a first chipset, and a second group of the backend components may be integrated into a second chipset, each having combinations of any of the components described. Other partitions of the backend components into groups and integration of the groups into respective chipsets also may be implemented.

Some implementations of the backend components may include broadband noise source unit; a tapped delay-line having 1-bit signal sampling and storage unit, and a real-time correlator unit. Other implementations may include other types of tapped delay lines having multi-bit signal sampling and storage unit(s).

Some implementations of the disclosed technologies may combine extant noise sources that may be defined in asynchronous logic gates with a signal sampling and signal processing architecture that also may be defined in asynchronous logic gates. Extant commercially available reconfigurable platforms may define asynchronous gate arrays using only software, and, therefore, implementations of the disclosed noise radar technologies may be implemented using only software-defined structures, such as reconfigurable logic devices. Put another way, components and architectures described herein may be implemented in software, hardware, and combinations thereof. As an example, the backend components, frontend components, and combinations thereof may be implemented in hard-coded hardware logic, programmable logic, software, and combinations thereof.

Figure 1:
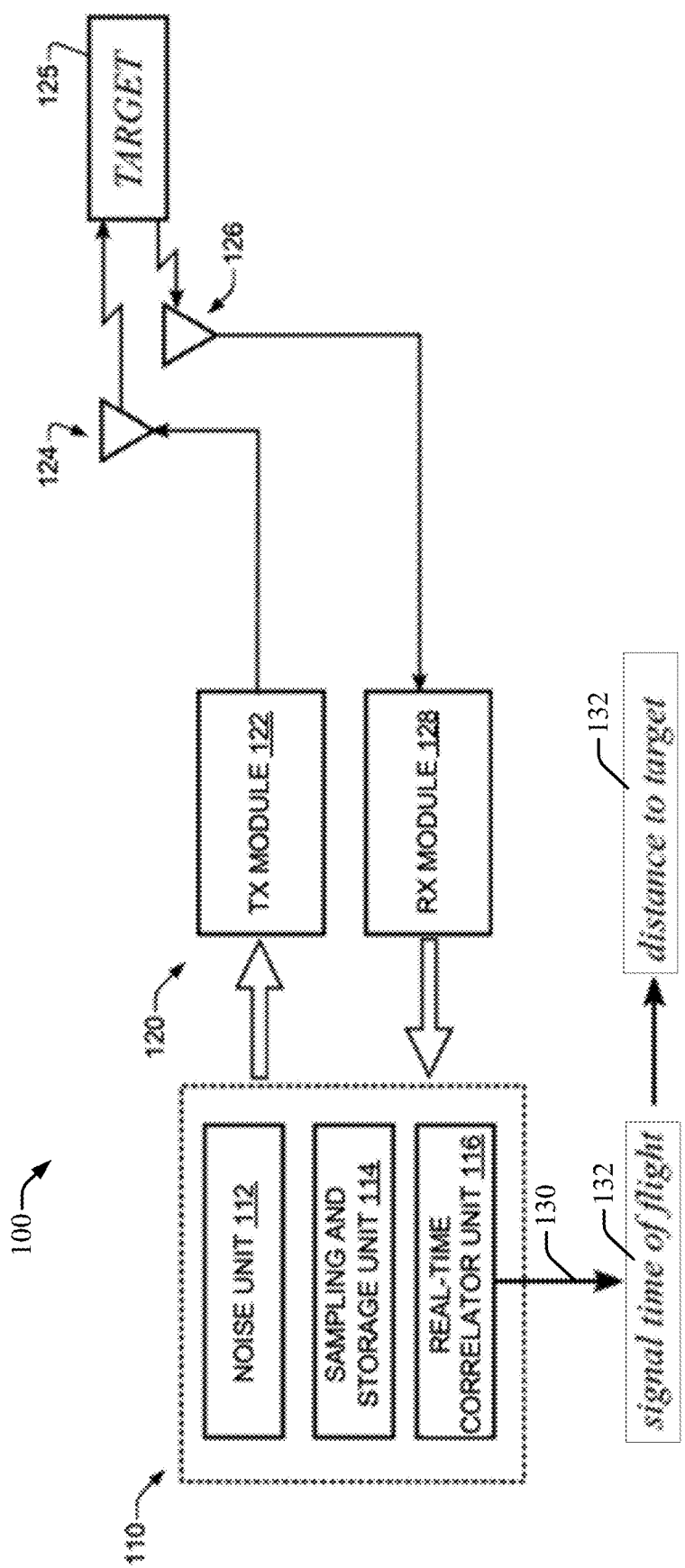
FIG. 1 illustrates an example of a noise radar apparatus, in accordance with one or more implementations of this disclosure.

The technologies of this disclosure are technical improvements over several (if not all) of the technical challenges that may be present in conventional noise radars. FIG. 1 is a schematic block diagram of a noise radar apparatus 100, in accordance with one or more implementations of this disclosure. The noise radar apparatus 100 includes backend components 110 functionally, electrically or otherwise, coupled to frontend components 120. Put another way, and as a non-limiting example, the backend components 110 may be electrically conductive with the frontend components 120. As another non-limiting example, the backend components 110 may be in communication through electromagnetic waves. The backend components 110 may include a noise unit 112, a sampling and storage unit or storage circuitry 114, and a real-time correlator unit or correlator circuitry 116. The backend components 110 may be formed in one or several asynchronous gate arrays. In some implementations, the noise unit 112 may be embodied in a first chipset (e.g., a field-programmable gate array (FPGA) or an application specific integrated circuit (ASIC); the sampling and storage unit 114 may be embodied in second chipset; and the real-time correlator unit 116 may be embodied in a third chipset. Put another way, the noise unit 112, sampling and storage unit 114, and a real-time correlator unit 116 are comprised of circuitry, software, and combinations thereof. The circuitry may include elementary components, logic gates, processors, or combinations thereof.

The noise unit 112 that may generate a signal. The signal may be of noise (e.g., broadband noise signals). In contrast to conventional noise sources, the noise unit 112 may generate broadband noise signals that are not repeated over multiple generation instances. In addition, rather than relying on an analog source device to generate uncorrelated signals, the noise unit 112 may generate broadband noise signals in digital fashion. Thus, instead of including analog electronics or optic components, the noise unit 112 may be formed from an asynchronous logic elements.

Simply as an illustration, FIG. 2 presents an example of the noise unit 112, in accordance with one or more implementations of this disclosure. As is illustrated in FIG. 2, the noise unit 112 may include a network of asynchronous logic elements. Such a network is configured to output multiple unclocked switching waveforms. Those waveforms may be truly random and uncorrelated. More specifically, yet not exclusively, the network includes an XNOR logic gate 208 with time-delayed feedback implemented using a delay network 210 of cascaded logic gates 212, 214, 216. The logic elements may include delay circuitry 202, 204, 206. Any quantity may be used in various configurations. An example of delay circuitry 202, 204, 206 is shown in FIG. 2B. As an example, the delay circuitry 202, 204, 206 may include inverter gates 230. A delay line or delay circuit may include different combinations of delay elements. Delay elements, as shown, may include inverters, conductive wire, elementary components, gates, components, integrated circuitry, and combinations thereof. The capacitance and impedance, and other elementary electrical components or concepts (inductance), of the gates or delay circuitry 202, 204, 206 creates a cumulative propagation delay while maintaining a digital or binary waveform. Put another way, delays may be created through line delays and inverter 230 delays while a substantially digital or substantially binary signal is maintained by low-pass, RC circuitry 232. Other forms of low-pass circuitry are contemplated. The output switching waveform 220, v(t), may be a pulse train of binary amplitude and random switching times.

The bandwidth of these output switching waveforms 220 may be adjusted using additional asynchronous logic, shown as cascaded logic gates 212, 214, 216 to tune or control minimum and maximum allowable times between switching. As an example, the cascaded logic gates 212, 214, 216 may be bistables having a first input, second input, first output, and second output. The first input may be designated as a clock input and receive the output switching waveforms 220 or signal from the noise generator 112. The second input may be designated as a delay input, which may receive a signal from the first output or inverted output, $\overline{Q}$. The second output or bistable output, Q, may be cascaded with the next cascaded logic gate 212 as a clock input or another designation. As another, the cascaded logic gates 212, 214, 216 may be latches or flip-flops, and in one instance, the latches or flip-flops may be delay or "D" type flip-flops. Those waveforms may then be used as the baseband sources (e.g., broadband noise signals or more generally noise signal or signal 218) x(t) in the noise radar apparatus 100. In some implementations, bandwidth tuning may be performed using D-type flip-flops shown as logic gates 212, 214, 216 that may switch high only on the rising edge other their inputs. An illustration, FIG. 2 presents a single time-division stage from the output switching waveform 220, v(t), to a time-divided waveform 222, z(t), resulting in the waveforms shown in FIG. 2C. Put another way, the logic gates 212, 214, 216 may be orchestrated and tuned in a cascade to effectively extend the shortest pulses of the output switching waveforms 220 to form the signal 218. As an example, the quantity of transitions between the maximum digital voltages of the signal may be reduced.

Generating noise signals using a noise unit 112 as is shown in FIG. 2 provides several improvements over conventional noise sources. In an example, the random switching signals are naturally broadband (e.g., bandwidth is greater than 100 MHz) and may be generated without reliance on analog electronics generate. Further, such signals are asynchronous and truly random, that is, the signals cannot be produced or predicted using conventional algorithmic approaches from clocked software-defined radios (SDRs). In another example, noise signals do not interfere with each other because they are uncorrelated. As such, the signals may be used simultaneously with multiple channels or users (e.g., instances of the noise radar apparatuses of this disclosure) at another location. In yet another example, the noise signals may be fully defined using software in a field-programmable gate array (FPGA), a reconfigurable platform that may hardwire asynchronous logic elements. Other types of reconfigurable logic devices also may be contemplated to generate a noise source, such as the noise unit 112. Also integrated into the FPGA, the additional asynchronous logic for tuning or controlling a noise signal bandwidth also may be software-defined. Put another way, the pulse width of the signal 218 may be increased using the cascaded logic gates 212, 214, 216 to remove the highest frequency perturbances in the signal 218. In still another example, the noise signals are composed of binary switching waveforms, which may permit using a 1-bit storage of the analog information to store the signal amplitudes. It is noted that, as mentioned, some implementations may include other types of tapped delay lines having multi-bit signal sampling and storage unit.

With further reference to FIG. 1, the backend components 110 also may include sampling and storage unit 114 that may sample a broadband noise signal using pre-defined taps, the broadband noise signal being generated by the noise unit 112. The sampling and storage unit 114 may be formed from asynchronous logic elements, and may include a delay line. The delay line may be composed of asynchronous cascaded logic elements that, for example, are similar to those discussed with regard to noise unit 112.

Figure 3A:
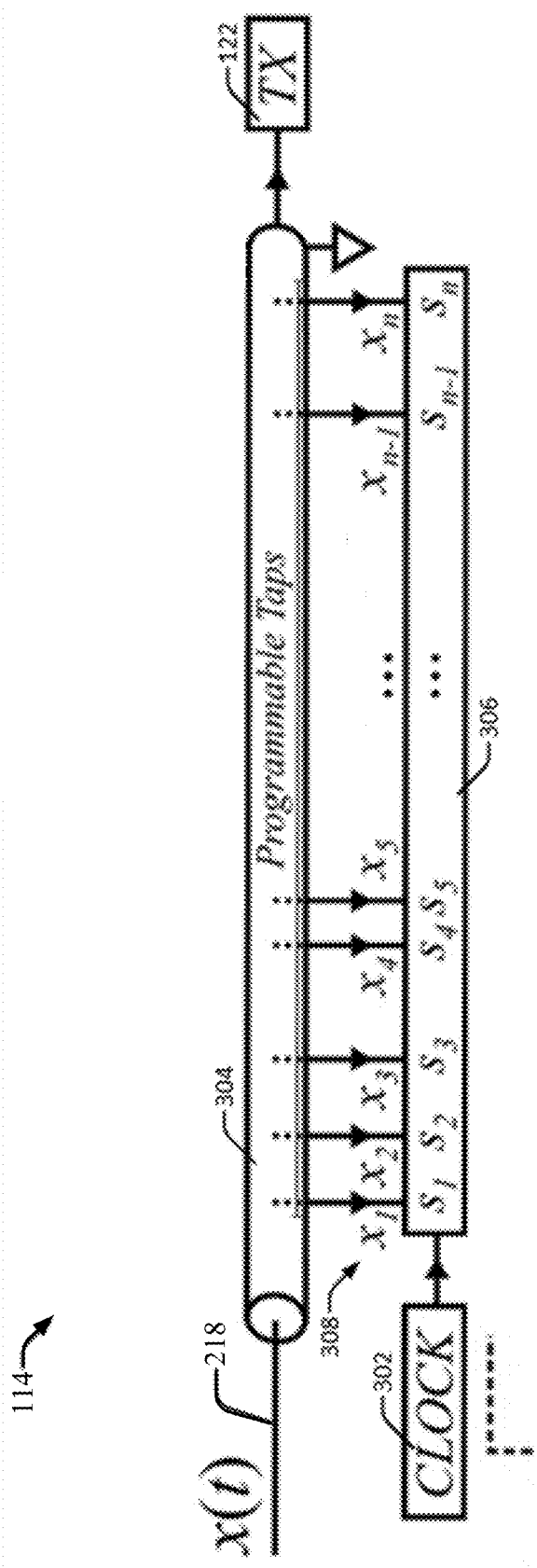
FIG. 3A illustrates an example of a sampling and storage unit that may be integrated into noise radar apparatuses in accordance with one or more implementations of this disclosure.
Figure 3B:
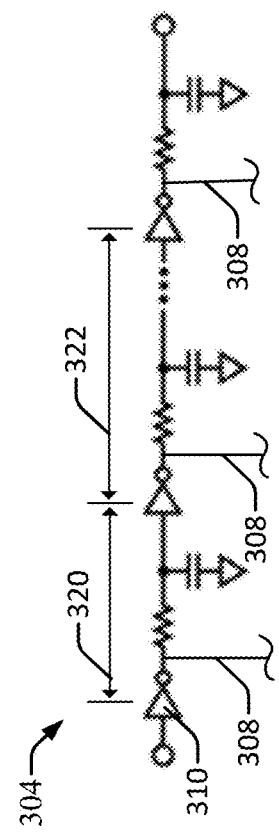
FIG. 3B illustrates a delay elements of a delay line of programmable taps.

With regard to FIG. 3, prior to transmitting the information content in the broadband noise signal 218 (e.g., a random switching signal), the broadband noise signal may be propagated through the delay line of programmable taps 304. After a particular portion of the broadband noise signal 218 is present in the delay line of programmable taps 304, voltage values at respective outputs 308 of select logic elements along the delay line are sampled and retained in a static memory device 306 (e.g., one or several registers). Put another way, the delay line of programmable taps 304 may be defined by a circuit, or portion thereof, configured to delay portions of the signal 218. The delay elements, as shown, may include inverters, conductive wire, elementary components, gates, components, integrated circuitry, and combinations thereof.

More concretely, the input to the delay line may be signal 218, x(t), generated by the noise unit 112. The capacitance and impedance of the gates present in the delay line of programmable taps 304 may create a cumulative propagation delay. Along the delay line, discrete taps may be placed at defined spacings and may route copies of the logic element outputs 308 from the corresponding locations to a sampling register or another type of memory device, static memory device 306. Such spacings may be uniform or non-uniform. As an example, a delay line of elements 310 is shown, the elements may be binary signal inverters. Only one delay element is designated for brevity. The delay elements may be spaced. Distances 320, 322 are not to scale and may show how different distances between the delay elements may cause different delays within the signal 218, allowing capture of one or more bits according to clock 302 for correlation. Similar distances may be depicted throughout this disclosure (e.g., FIGS. 2, 4). In some configurations, random or pseudo-random spacings may be used to sample the signal 218, x(t). In one of those configurations, such spacing may be sub-Nyquist and may be used in conjunction with compressive sensing algorithms to recover signal content. In addition, the locations and spacings of the taps along the delay line may be specific to the bandwidth of the reference waveform x(t) (e.g., a broadband noise signal 218). Put another way, the spacing of the delay line of programmable taps 304 may be less than, or equal, the Nyquist frequency of the highest frequency within the signal 218 as defined by logic gates 212, 214, 216. For larger bandwidths, the spacings may be smaller which results in the taps being in closer proximity. Conversely, for smaller bandwidths, the spacings may be larger which results in the taps being farther apart.

On the rising edge of a reference signal, such as a clock signal 302, the registers sample and retain respective observed values from the taps. Such a sampling process may result in a 1-bit sampling and storage device 114. The signal 218, x(t), may then be used as the baseband signal for the noise radar apparatus 100. The clock signal 302 may be tuned based on the expected distance of the target 125 such that signals transmitted to the are returned before the rising edge of the next clock signal. The signal 218 is then transmitted by transmitter 122. It should be appreciated that a second path may connect an unaltered version of the signal 218 from the noise unit 112 directly to the transmitter in parallel to the delay line of programmable taps 304.

In an example, the signal may be detected with a brief snapshot of the noise signal less frequently than the maximum switching frequency present in the noise signal. For example, the clock 302 may be half the maximum switching frequency. In another example, the clock frequency may be orders of magnitude less than the maximum switching frequency.

In some implementations, the delay line of programmable taps 304 and sampling process may be entirely defined using software in a field-programmable gate array (FPGA), a reconfigurable platform that may hardwire asynchronous logic elements. Other types of reconfigurable logic devices also may be contemplated to form the tapped delay line and sampling process. As such, in those implementations, the length of the delay line and tap spacing and locations also may be software-defined and reconfigurable at any time. Within the same FPGA, the samples also may be stored in various types of memory devices (for example, registers, RAM, and similar). These samples may be retained for later use or passed to another one of the backend components 110 for processing, as is described in greater detail below.

Back to FIG. 1, the broadband noise signal 218 generated by the noise unit 112 may be transmitted or otherwise input into a transmitting (TX) module 122 included in the frontend components 120. The TX module 122 may receive the broadband noise signal 218 and may cause one or several TX antennas 124 to send electromagnetic radiation.

Figure 4:
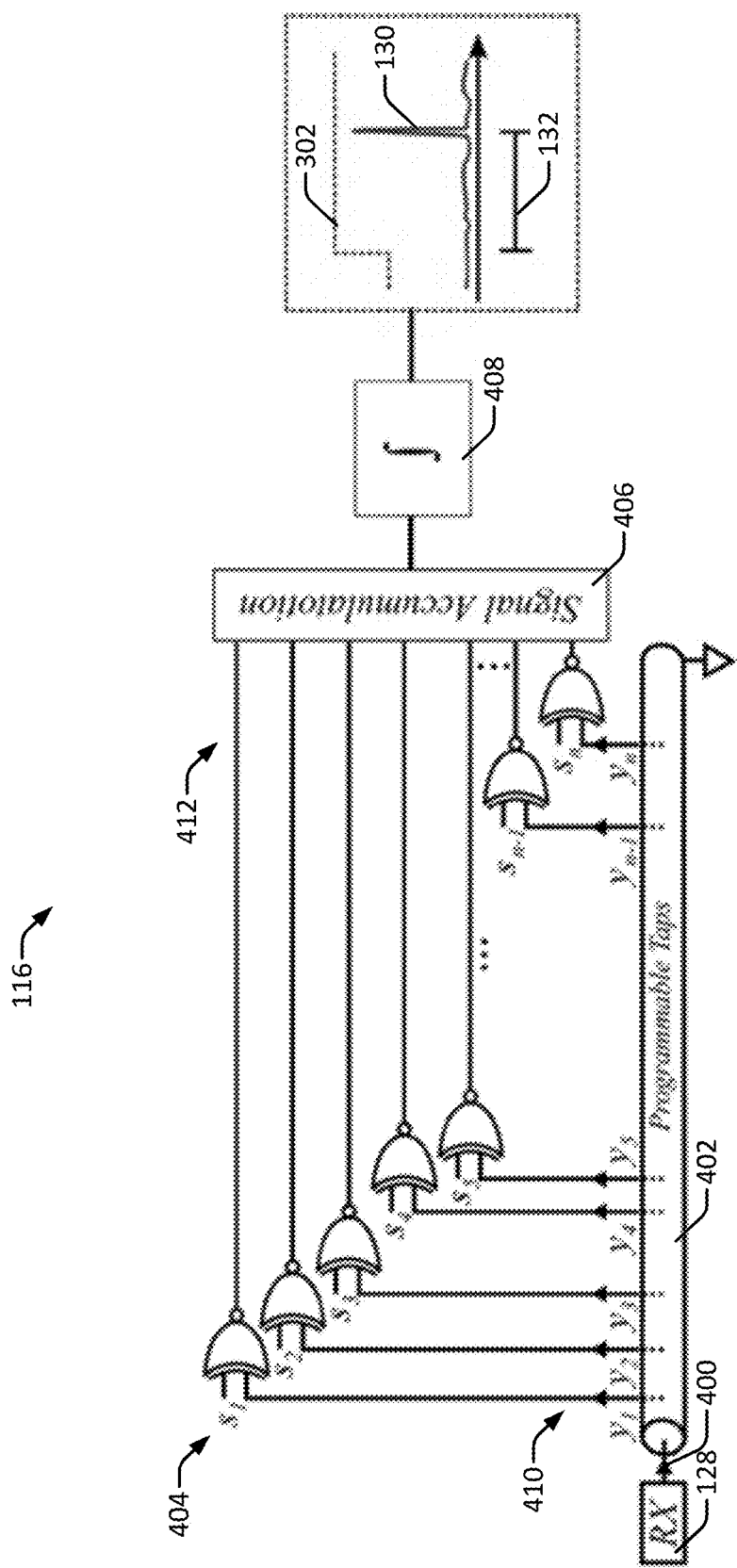
FIG. 4 illustrates an example of a real-time correlator unit that may be integrated into noise radar apparatuses in accordance with one or more implementations of this disclosure.

At least a portion of the electromagnetic radiation may be reflected on a target object 125 located a distance from the noise radar apparatus 100. The reflected electromagnetic radiation and environment noise signal may be received at one or several receiving (RX) antennas 126 included in the noise radar apparatus 100. The noise radar apparatus 100 may include an RX module 128 coupled to the RX antenna (s) 126. The RX module 128 may process the received electromagnetic radiation to generate a signal representative of such electromagnetic radiation. Because the reflected electromagnetic radiation corresponds to transmitted electromagnetic radiation based on a broadband noise signal 218, such a signal also may be a noise signal. In some instances, the noise signal also may be a switching waveform. For the sake of nomenclature, such a switching form may be referred to as received switching waveform 400, as depicted in FIG. 4.

The RX module 128 may transmit or otherwise input the received switching waveform 400 into a real-time correlator unit 116 included in the backend components 120. In some cases, the input to the real-time correlator unit 116 may be down-converted signal from the RX module 128. The timing of the pulse relative to a reference signal or clock 302 from the sampling and storage unit 114 may be used to measure time of flight for the transmitted electromagnetic radiation based on the broadband noise signal 218 generated by the noise unit 112.

The real-time correlator unit 116 may process a received switching waveform 400 (e.g., reflected signal from target 125) in order to detect a pre-defined sequence of switching. The real-time correlator unit 116 may be formed from asynchronous cascaded logic elements 404, for example. The pre-defined sequences may be the sampled bit values generated by the sampling and storage unit 114.

To detect the pre-defined sequence, in some implementations, the real-time correlator unit 116 may include a correlator delay line 402 that is matched to the delay line of programmable taps 304 included in the sampling and storage unit 114. For example, the length of delay and locations of correlator taps 410 of the correlator delay line 402 are the same as the delay and locations of taps 308 in the delay line of programmable taps 304 included in the sample and storage unit 114. Accordingly, tap spacings in the correlator delay line 402 may be uniform or non-uniform. In some configurations, random or pseudo-random spacings may be used to detect waveform of interest corresponding to the received switching waveform. In addition, the locations and spacings of the taps 410 along the correlated delay line 402 may be specific to the bandwidth of the received switching waveform 400. For larger bandwidths, the spacings may be smaller which results in the taps 410 being in closer proximity. Conversely, for smaller bandwidths, the spacings may be larger which results in the taps 410 being farther apart.

The received switching waveform 400 may be propagated through the correlator delay line 402. As the received waveform propagates through the correlator delay line 402, voltage values at each of the taps 410 are checked in essentially continuous time against the sampled values from the pre-defined sequence of the sample and storage unit 114. When a match between voltages is present at a given tap, the real-time correlator unit 116 may generate a signal to indicate that match. If all of the taps show a match, there is a high probability that the pre-defined sequence is present in the correlator delay line. Thus, by continuously monitoring all of the taps and accumulating respective outputs, the real-time correlator unit 116 may provide a single output signal 130 that has maximal value when the signal of interest is detected as an indication that the received signal is based on the transmitted signal, and the signal time of flight 132 may be determined. This accumulation process by accumulator 408 may be embodied in, for example, summing, counting, multiplying, averaging, etc. It is noted that real-time correlator unit 116 detect the signal of interest in essentially real-time, without reliance on sampling and storage of the received switching waveform or reflected signal 400. Accordingly, the received switching waveform 400 may be recognized if the stored bit is equal to the received value of the switching waveform. If every 1-bit sample is equal to the tapped value from correlator taps from the correlator delay line 402, the signal aggregator 406 passes this indication to the accumulator 408 to generate the indication 130. The signal aggregator 406 may be an AND gate that is true when all of the 1-bit samples match the received switching waveform 400 as transmitted by bus 412.

The correlator delay-line and detection process may be fully defined using only software in a Field-Programmable Gate Array (FPGA), a reconfigured platform that may hard wire asynchronous logic elements. Other types of reconfigurable logic devices also may be contemplated to form the correlator delay line and detection process. As such, the length of the delay line and the tap spacing and locations also may all be software-defined and reconfigurable at any time to match the tap locations and stored bit values from the sampling and storage unit 114. Within the same FPGA, the accumulation process may be constructed using asynchronous networks of gates.

It is noted that the accumulation signals from repeated, back-to-back samplings in the sampling and storage unit 114 of a random waveform, and detection performed by the real-time correlator unit 116 may be integrated or averaged over time to suppress noise and interference. This integration or averaging process is a real-time correlation and may be performed by integrator 408.

In an example, the receiver may employ only binary indications of the signal for correlation and without a clock (e.g., in real time). Further, the correlation may be performed using only logic or digital gates. And, the XNOR gates compare the received signal to the stored binary values.

Figure 5:
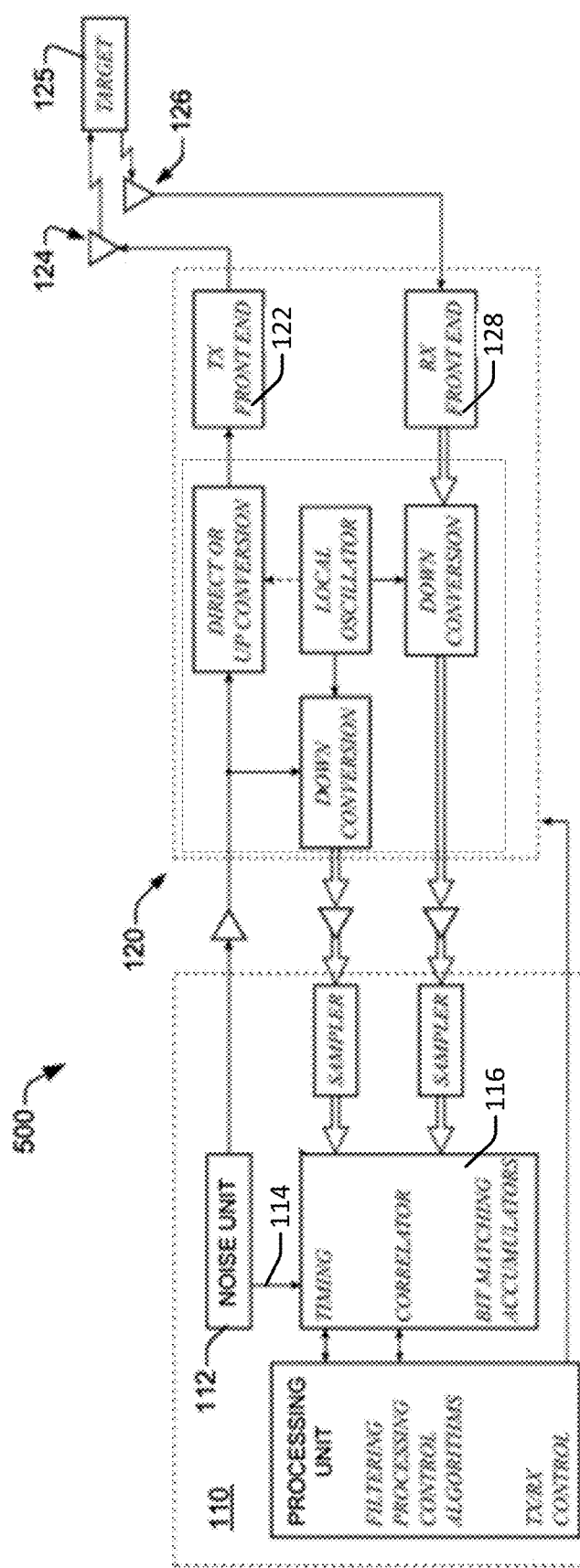
FIG. 5 illustrates another example of a noise radar apparatus, in accordance with one or more implementations of this disclosure.

FIG. 5 is a schematic block diagram of an example of a noise radar apparatus 500, in accordance with one or more implementations of this disclosure. As is disclosed herein, backend components of the noise radar apparatus 200 may be formed from one or several asynchronous gate arrays. Accordingly, those backend components may be embodied in an FPGA or an application specific integrated circuit (ASIC), or a combination of both.

In FIG. 6A, signal 220 is generated using asynchronous gates on a FPGA. As shown in oscilloscope output 600, the digital signal 220 includes digital transitions between zero and two Volts. Digital transitions may be transitions in the signal between a percentage of the two-volt range (e.g., any transition that is greater than 75% of two Volts or 1.5 V). An average, mean, median, or otherwise, period 606 between the digital transitions is shown. A highest switching frequency (e.g., 1.2 GHz) may be associated with the shortest average period 606 between digital transitions or fastest digital transitions. Digital transitions may not be instantaneous causing the period between digital transitions to vary between two digital transitions, as shown. In FIG. 6B, the autocorrelation function, demonstrating the uncorrelated and random nature of the signal 220. In FIG. 6C, power spectral density (PSD) is illustrated, demonstrating the uncorrelated and random nature of the baseband switching noise and various frequencies within the digital signal 220 (e.g., 0-1.2 GHz).

Figure 7:
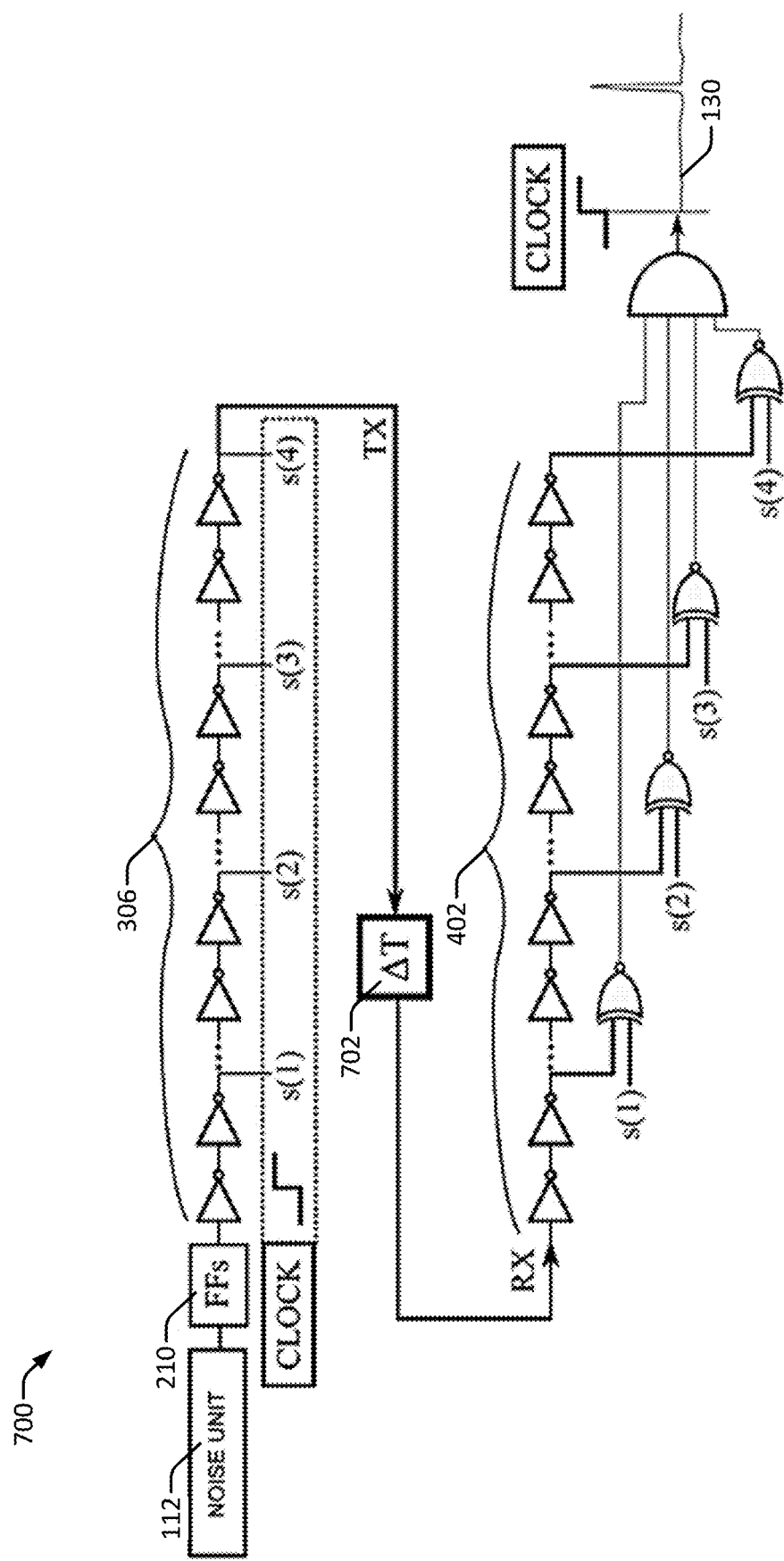
FIG. 7 illustrates experimental setup for a proof-of-concept test for the noise radar backend components using asynchronous gate arrays, in accordance with one or more implementations of this disclosure. The entire illustrated experimental setup is software-defined on a single FPGA. A single reconfigurable logic device of another type also may be utilized.

In FIG. 7, an example of switching noise generation on an FPGA is shown. The bandwidth of the noise is limited using flip flops (FF) as cascaded logic gates 212, 214, 216. These flips flops or delay gates may be used to down sample the chaos in case the raw bandwidth is too high for a given applications. Next, the switching noise is sent through an inverter delay line, where taps are placed along the delay. In this example, four taps are used that are spaced by 10 inverters. These taps sample the value of the delay line on the rising edge of clock (also supplied by the FPGA) and store them in registers s. The output of the tapped delay-line is then "transmitted" (TX) through a longer delay path to represent or simulate a path of interest (e.g. distance to target). The received (RX) signal is then sent through a correlator delay-line with taps placed at the sample locations as the transmitter. Lastly, the values of the registers s are then used to "multiply" the tap outputs in continuous time. The XNOR outputs are then fed into a reduction AND-gate.

To test this correlator, a broadband oscilloscope may be used to trigger on the rising edge of the clock and then average the signals to simulate the integration process. It is expected that, when averaged, the output of the AND-gate may produce a peak that corresponds to the delay time $\Delta T+\tau$. Snapshots from experimental data are shown in FIG. 7, FIG. 8, FIG. 9, and FIG. 10.

FIG. 7 illustrates experimental setup for a proof-of-concept test for the noise radar backend components using asynchronous gate arrays, in accordance with one or more implementations of this disclosure. The entire experimental setup is software-defined on a single FPGA. A single reconfigurable logic device of another type also may be utilized.

Figure 8:
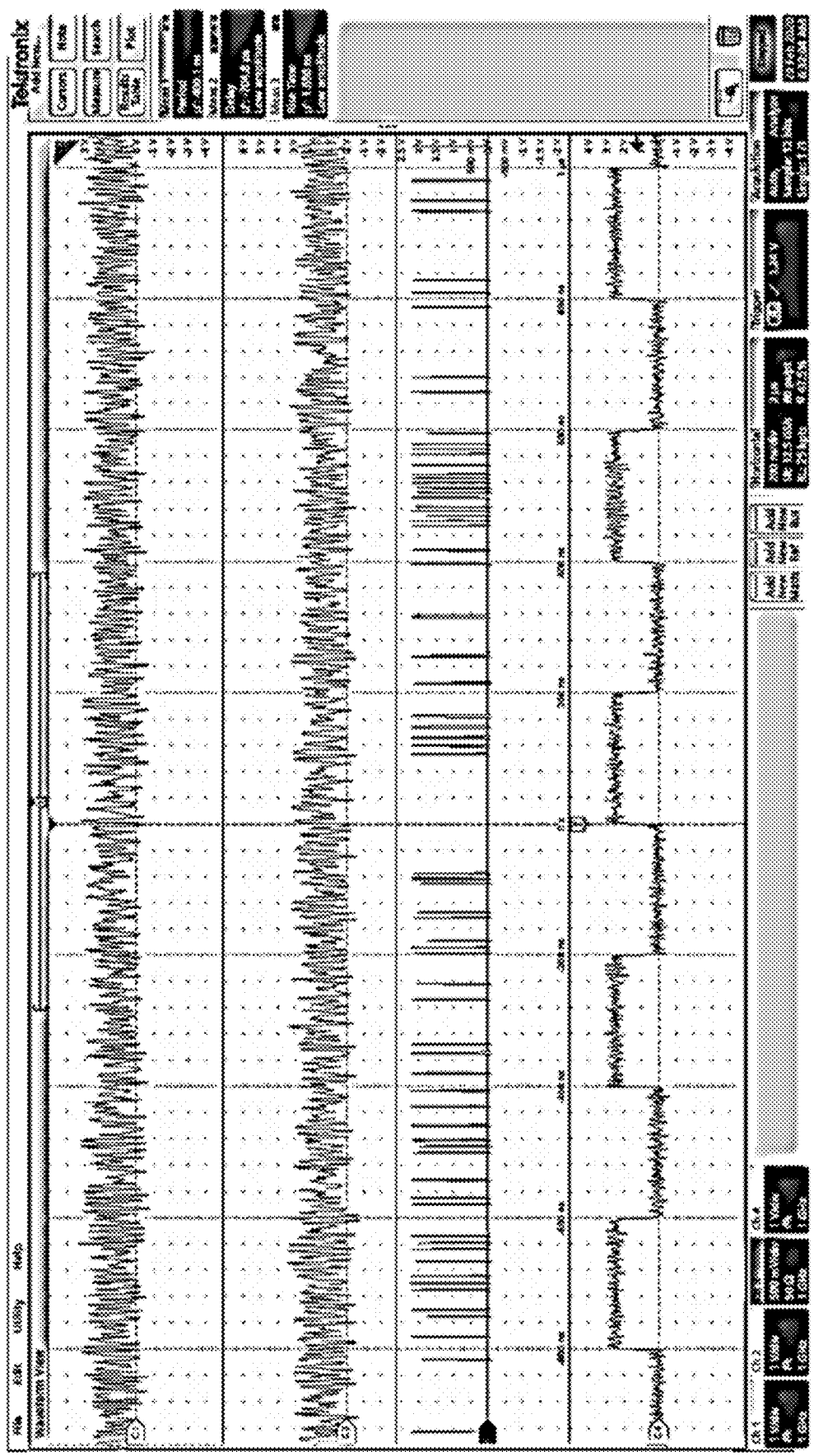
FIG. 8 illustrates experimental data measured from various outputs of the setup shown in FIG. 7, in accordance with one or more implementations of this disclosure.

FIG. 8 illustrates experimental data measured from various outputs of the setup shown in FIG. 7, in accordance with one or more implementations of this disclosure. Channel 1 (yellow) is the filtered version of the switching noise x(t) using flip-flops. Channel 2 (blue) is the time delayed version of x(t) after the delay $\Delta T$. Channel 3 (red) is the output of the reduction AND-gate. Channel 4 (green) is a periodic 2.5 MHz clock (switching noise is present from coupling across probes).

Figure 9:
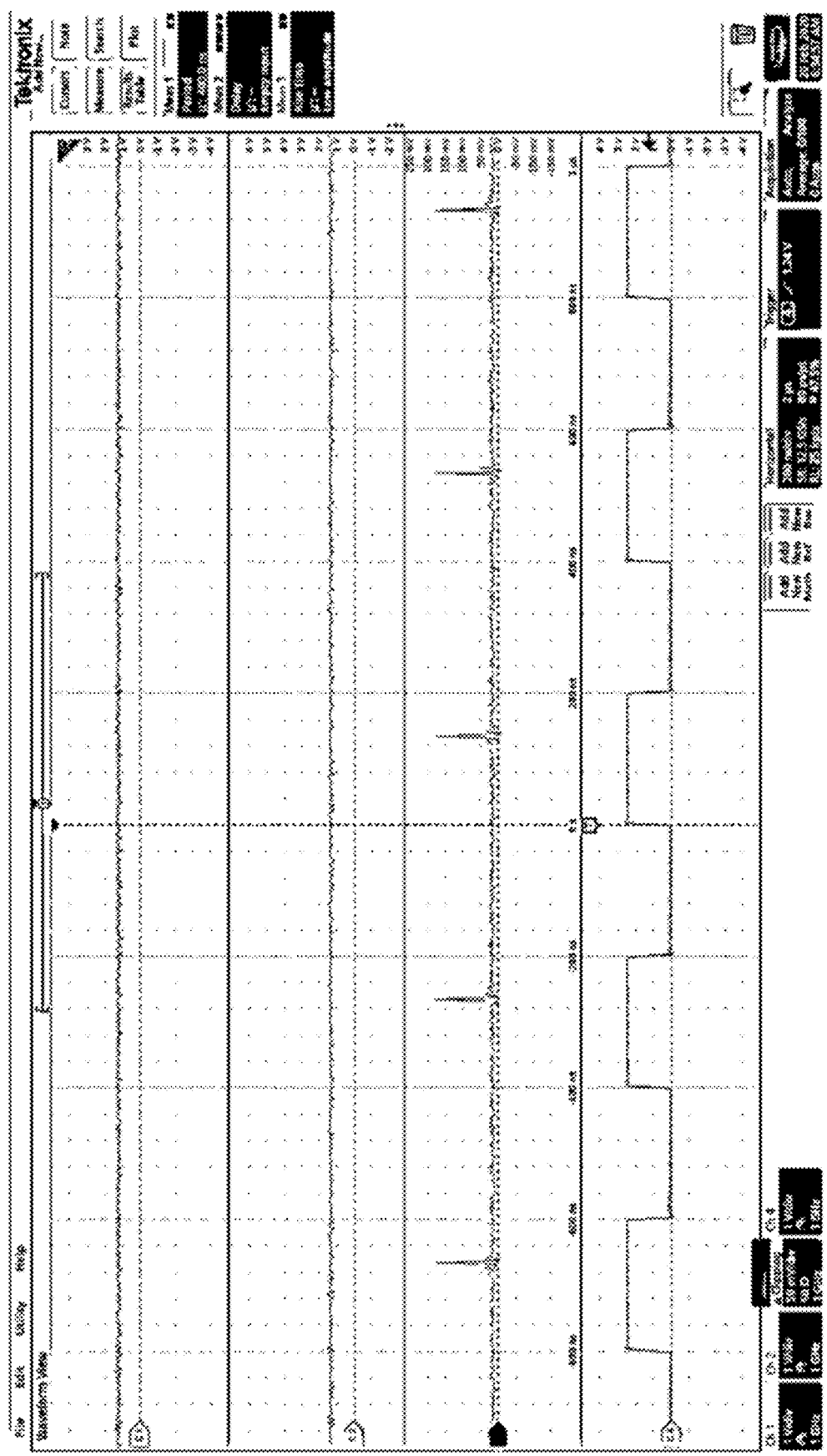
FIG. 9 illustrates other experimental data measured from various outputs of the setup in FIG. 7 with averaging enabled, in accordance with one or more implementations of this disclosure.

FIG. 9 illustrates other experimental data measured from various outputs of the setup shown in FIG. 7 with averaging enabled, in accordance with one or more implementations of this disclosure. Channel 1 (yellow) is the filtered version of the switching noise using flip-flops. Channel 2 (blue) is the time delayed version of x(t) after the delay $\Delta T$. Channel 3 (red) is the output of the reduction AND-gate. Channel 4 (green) is a periodic 2.5 MHz clock (switching noise is present from coupling across probes).

Figure 10:
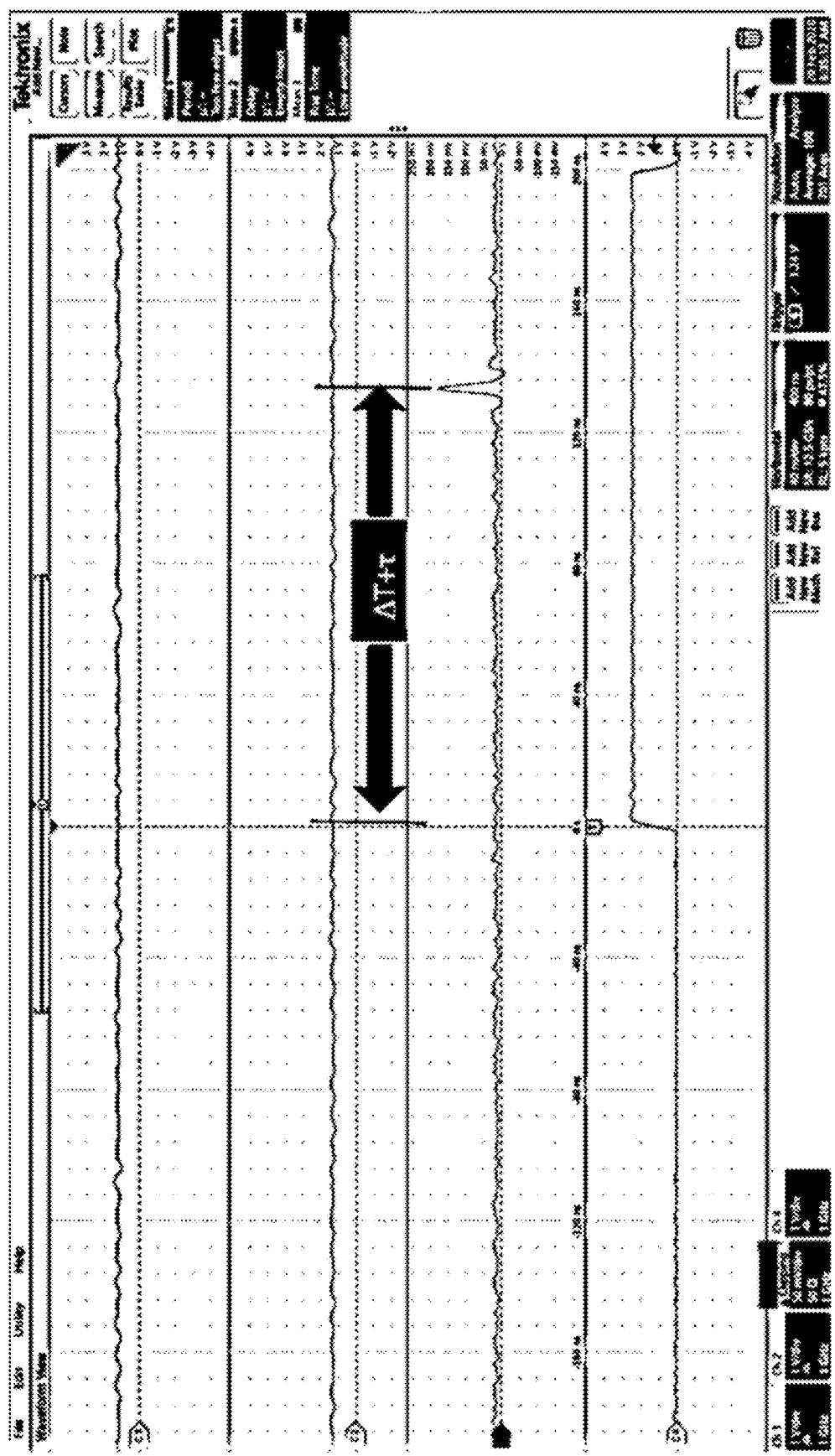
FIG. 10 illustrates zoom of experimental data measured from various outputs of the setup shown in FIG. 7 with averaging enabled, in accordance with one or more implementations of this disclosure.

FIG. 10 illustrates zoom of experimental data measured from various outputs of the setup shown in FIG. 7 with averaging enabled, in accordance with one or more implementations of this disclosure. Channel 1 (yellow) is the filtered version of the switching noise using flip-flops. Channel 2 (blue) is the time delayed version of x(t) after the delay $\Delta T$. Channel 3 (red) is the output of the integrator or averaging function. Channel 4 (green) is a periodic 2.5 MHz clock (switching noise is present from coupling across probes). The time between the clock's rising edge to the averaged peak from the AND-gate is $\Delta T+\tau$, as expected.

Figure 11:
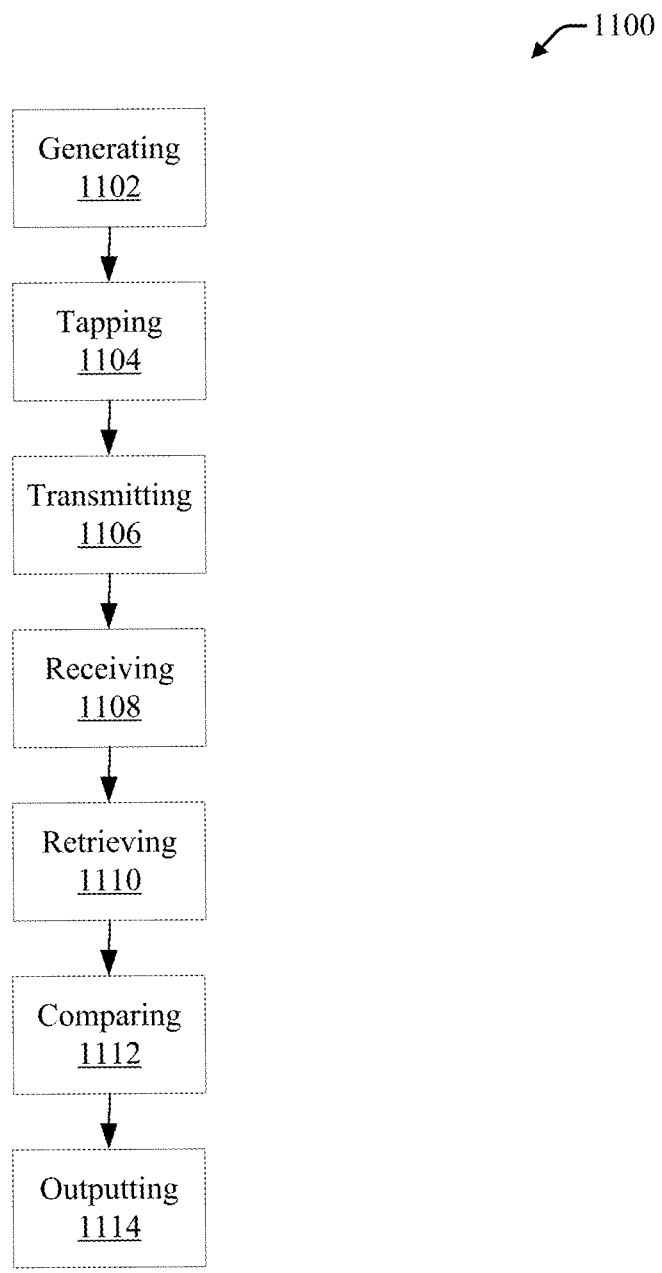
FIG. 11 illustrates a method for measuring distances between a transmitter and a target.

FIG. 11 illustrates a method for measuring distances between a transmitter and a target in accordance with one or more implementations of the present disclosure. FIG. 11 discloses a combination of steps. Some of the steps may be omitted, duplicated, or rearranged. In step 1102, a signal is generated. The signal can be generated according to one or more delay circuitries. The delay circuitries may include any number of delay elements. The delay circuitries may delay received signals by different amounts to generate a substantially unique waveform. The signal may be delayed or augmented to remove fast switching frequencies of the digital signal. As an example, a cascade of logic gates 210 may be used. In step 1104, the signal is tapped to provide a snapshot of the contemporaneous values depicted therein. The taps 308 may be at various distances along a transmission line, and the values may be stored in registers. The registers may be various types of digital memory. The signal may be subsequently or simultaneously transmitted, toward a target 125 for ranging in step 1106. As an example, the signal may reflect off the target 125 and return to a receiver 128. In step 1108 the contemporaneous values are retrieved from storage and fed to comparators, which may be exclusive NOR gates 404. In step 1110, the contemporaneous values are compared with the received, and reflected, signal. In step 1112, an indication 130 is provided that indicates how far the target 125 is from the receiver 128 and transmitter 122. The time delay may be measured to determine such a distance 132.

In an example, the radar may define a logic gate having a digital input operable to receive a first input and an output operable to define a signal based on the first input, the logic gate having an exclusive OR circuitry. The radar may define first delay circuitry having an first inverter, the first delay circuitry operable to receive the signal and define the first input according to the first inverter.

Continuing, the digital input is operable to receive a second input. The radar may further define a second delay circuitry having a second inverter, the second delay circuitry operable to receive the signal and define the second input according to the second inverter, wherein the first delay circuitry and the second delay circuitry comprise respective low-pass filters configured to filter the respective input and the second input.

The first delay circuitry comprises a third inverter, the first inverter spaced from the third inverter a first distance defining a first delay and operable to receive the signal, the third inverter operable to define the first input according to the first delay.

The second delay circuitry comprises a fourth inverter, the second inverter spaced from the fourth inverter a second distance defining a second delay and operable to receive the signal, the fourth inverter operable to define the second input according to the second delay.

The radar may further define a first bistable having a clock input, a delay input, a bistable output, and an inverted output, the clock input configured to receive the signal, the delay input configured to receive the inverted output, and the bistable output configured to output a reduced oscillation signal having fewer digital transitions than the signal.

The radar may further define a second bistable having a second clock input, a second delay input, a second bistable output, and a second inverted output, the second clock input configured to receive the reduced oscillation signal, the second delay input configured to receive the second inverted output, and the second bistable output configured to output a further reduced oscillation signal having fewer digital transitions than the reduced oscillation signal. The radar may define additional components and operations.

While the technologies (e.g., techniques, computer program products, devices, and systems) of this disclosure have been described in connection with various embodiments and specific examples, it is not intended that the scope be limited to the particular embodiments put forth, as the embodiments herein are intended in all respects to be illustrative rather than restrictive A component may be localized on one processing device or distributed between two or more processing devices. Components may communicate via local and/or remote architectures in accordance, for example, with a signal (either analogic or digital) having one or more data packets (e.g., data from one component interacting with another component in a local processing device, distributed processing devices, and/or across a network with other systems via the signal).

As yet another example, a component may be embodied in or may include an apparatus with a defined functionality provided by mechanical parts operated by electric or electronic circuitry that is controlled by a software application or firmware application executed by a processing device. Such a processing device may be internal or external to the apparatus and may execute at least part of the software or firmware application.

Still in another example, a component may be embodied in or may include an apparatus that provides defined functionality through electronic components without mechanical parts. The electronic components may include signal processing devices to execute software or firmware that permits or otherwise facilitates, at least in part, the functionality of the electronic components. For the sake of illustration, an example of such processing device(s) includes an integrated circuit (IC), an application-specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed or otherwise configured (e.g., manufactured) to perform the functions described herein.

In some embodiments, components may communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, components may communicate or otherwise be coupled via thermal, mechanical, electrical, and/or electromechanical coupling mechanisms (such as conduits, connectors, combinations thereof, or the like). An interface may include input/output (I/O) components as well as associated processors, applications, and/or other programming components.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The flowchart and block diagrams in the Figures illustrate the architecture, functionality, and operation of possible implementations of examples of systems, methods, and computer program products according to various embodiments of the present disclosure. In this regard, each step or block in the flowchart or block diagrams may represent a module, segment, or portion of instructions, which includes one or more machine-executable or computer-executable instructions for implementing the specified operations. It is noted that each block of the block diagrams and/or flowchart illustration, and combinations of blocks in the block diagrams and/or flowchart illustration, may be implemented by special purpose hardware-based devices that perform the specified functions or operations or carry out combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

What has been described herein in the present specification and annexed drawings includes examples of systems, apparatuses, devices, and techniques for noise radar architectures that may include backend components formed from asynchronous gate arrays or other types of asynchronous logic elements. It is, of course, not possible to describe every conceivable combination of components and/or methods for purposes of describing the various elements of the disclosure, but it may be recognized that many further combinations and permutations of the disclosed elements are possible. Accordingly, it may be apparent that various modifications may be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

What is claimed is:

1. A radar comprising:
storage circuitry comprising a first tap, wherein the storage circuitry is configured to transmit a first signal comprising switching frequencies defining digital transitions of the first signal, wherein the switching frequencies comprise a maximum switching frequency, wherein the maximum switching frequency comprises a shortest mean period between the digital transitions of the first signal with respect to the switching frequencies, and wherein the first signal has a power spectral density that is substantially constant over a bandwidth of 20 KHz; and
a register configured to receive the first signal according to the first tap, and store a representation of the first signal according to a clock signal having a clock frequency less than the maximum switching frequency.

2. The radar of claim 1, wherein the storage circuitry further comprises a second tap and a transmission delay circuit comprising a first delay element, a second delay element, and a third delay element, wherein the first delay element is spaced from the second delay element a first transmission distance with the first tap there between and the second delay element is spaced from the third delay element a second transmission distance with the second tap there between, wherein the storage circuitry is arranged such that the first signal traverses the first delay element before the second delay element.

3. The radar of claim 2, wherein the transmission delay circuit comprises an even quantity of delay elements, wherein the delay elements comprise the first delay element, the second delay element, and the third delay element, and wherein the delay elements are inverters.

4. The radar of claim 2, further comprising:
correlator circuitry comprising a correlator tap, wherein the correlator circuitry is configured to receive a second signal reflected from a target; and
an exclusive NOR gate configured to receive the correlator tap and the representation.

5. The radar of claim 4, wherein the correlator circuitry comprises a second correlator tap and a reception delay circuit comprising a third correlator delay element, a second correlator delay element, and a first correlator delay element, wherein:
the third correlator delay element is spaced the first transmission distance from the second correlator delay element with the second correlator tap there between,
the second correlator delay element is spaced the second transmission distance from the first correlator delay element with the correlator tap there between, and
the correlator circuitry arranged such that the second signal traverses the third correlator delay element before the second correlator delay element.

6. The radar of claim 5, wherein the correlator circuitry comprises an accumulator configured to transmit an indication that the second signal is based on the first signal transmitted from the radar.

7. The radar of claim 1, further comprising:
a first bistable circuit comprising a first clock input, a first delay input, a first bistable output, and a first inverted output, wherein the first clock input is configured to receive a second signal, the first delay input is configured to receive the first inverted output, and the first bistable output is configured to output the first signal, wherein the digital transitions of the first signal are fewer than digital transitions of the second signal over a duration.

8. The radar of claim 7, further comprising:
a second bistable circuit comprising a second clock input, a second delay input, a second bistable output, and a second inverted output, wherein the second clock input is configured to receive a third signal, the second delay input is configured to receive the second inverted output, and the second bistable output is configured to output the first signal, wherein the digital transitions of the second signal are fewer than digital transitions of the third signal.

9. The radar of claim 1, further comprising:
a logic gate configured to receive an input and an output operable to define a second signal based on the input, wherein the logic gate comprises an exclusive OR circuitry; and
delay circuitry comprising an inverter, wherein the delay circuitry is configured to receive the second signal and define the input according to the inverter, wherein the first signal is based on the second signal.

10. The radar of claim 1, wherein the first signal is substantially binary comprising an ON voltage and an OFF voltage, and wherein digital transitions between the ON voltage and the OFF voltage define periods that are unique over 8,000 nanoseconds.

11. The radar of claim 1, wherein a minimum power of the power spectral density over a 50 MHz band is within 10 dB of a maximum power of the power spectral density over the 50 MHz band.

12. A method comprising:
generating a first signal comprising switching frequencies defining digital transitions of the first signal, wherein the switching frequencies comprise a maximum switching frequency, wherein the maximum switching frequency comprises a shortest mean period between the digital transitions of the first signal with respect to the switching frequencies, and wherein the first signal has a power spectral density that is substantially constant over a bandwidth of 20 KHz; and
tapping the first signal to store contemporaneous values of the first signal in registers according to a clock signal, wherein the clock signal comprises a clock frequency less than the maximum switching frequency.

13. The method of claim 12, further comprising:
receiving a second signal based on the first signal reflected from a target;
receiving the contemporaneous values;
comparing the contemporaneous values with the second signal; and
outputting an indication that the second signal is based on the first signal.

14. A radar comprising:
correlator circuitry comprising a correlator tap, wherein the correlator circuitry is configured to receive a reflected signal based on a first signal reflected from a target, wherein the first signal comprises switching frequencies defining digital transitions of the first signal, wherein the switching frequencies comprise a maximum switching frequency, and wherein the maximum switching frequency comprises a shortest mean period between the digital transitions with respect to the switching frequencies; and an exclusive NOR gate configured to receive the correlator tap and a binary value based on the first signal.

15. The radar of claim 14, wherein the binary value is defined by a register configured to receive the first signal, wherein the register is configured to store the first signal according to a clock signal comprising a clock frequency less than the maximum switching frequency.

16. The radar of claim 14, wherein the correlator circuitry comprises a second correlator tap and a reception delay circuit comprising a third correlator delay element, a second correlator delay element, and a first correlator delay element, wherein the third correlator delay element is spaced from the second correlator delay element a first transmission distance with the second correlator tap there between and the second correlator delay element is spaced from the first correlator delay element a second transmission distance with the correlator tap there between.

17. The radar of claim 16 further comprising:

storage circuitry comprising a first tap, wherein the storage circuitry is configured to transmit the first signal; and a register configured to receive the first signal according to the first tap, and store the first signal according to a clock signal having a clock frequency less than the maximum switching frequency.

18. The radar of claim 17, wherein the storage circuitry comprises a second tap and a transmission delay circuit comprising a first delay element, a second delay element, and a third delay element, wherein the first delay element is spaced from the second delay element the first transmission distance with the first tap there between and the second delay element is spaced from the third delay element the second transmission distance with the second tap there between.

19. The radar of claim 18, wherein the transmission delay circuit comprises an even quantity of delay elements, the delay elements comprising the first delay element, the second delay element, and the third delay element, wherein the delay elements are inverters.

20. The radar of claim 19, further comprising:

a first bistable circuit comprising a clock input, a delay input, a bistable output, and an inverted output, wherein the clock input is configured to receive a second signal, the delay input is configured to receive the inverted output, and the bistable output is configured to output the first signal, wherein the digital transitions of the first signal are fewer than digital transitions of the second signal over a duration.

\* \* \* \* \*